United States Patent
Liaw

(10) Patent No.: US 7,233,032 B2
(45) Date of Patent: Jun. 19, 2007

(54) SRAM DEVICE HAVING HIGH ASPECT RATIO CELL BOUNDARY

(75) Inventor: Jhon Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 296 days.

(21) Appl. No.: 10/818,133

(22) Filed: Apr. 5, 2004

(65) Prior Publication Data

US 2005/0124095 A1 Jun. 9, 2005

Related U.S. Application Data

(60) Provisional application No. 60/527,857, filed on Dec. 5, 2003.

(51) Int. Cl.
*H01L 21/82* (2006.01)
*H01L 27/10* (2006.01)

(52) U.S. Cl. .................. 257/202; 257/204; 257/903

(58) Field of Classification Search ............... None
See application file for complete search history.

(56) References Cited

U.S. PATENT DOCUMENTS

| 6,822,300 | B2 * | 11/2004 | Nii ........................... 257/390 |
| 2001/0043487 | A1 * | 11/2001 | Nii et al. ..................... 365/154 |
| 2004/0120209 | A1 * | 6/2004 | Lee et al. ............... 365/230.05 |

* cited by examiner

*Primary Examiner*—Sue A. Purvis
*Assistant Examiner*—A. Sefer
(74) *Attorney, Agent, or Firm*—Haynes and Boone, LLP

(57) ABSTRACT

A static random access memory (SRAM) device including a substrate and an SRAM unit cell. The substrate includes an n-doped region interposing first and second p-doped regions. The SRAM unit cell includes: (1) a first pass-gate transistor and a first pull-down transistor located at least partially over the first p-doped region; (2) first and second pull-up transistors located at least partially over the n-doped region; and (3) a second pass-gate transistor, a second pull-down transistor, and first and second read port transistors, all located at least partially over the second p-doped region. A boundary of the SRAM unit cell comprises first and second primary dimensions having an aspect ratio of at least about 3.2.

28 Claims, 8 Drawing Sheets

SRAM DEVICE HAVING HIGH ASPECT RATIO CELL BOUNDARY

CROSS-REFERENCE

This application is related to the following commonly-assigned U.S. patent Application, the entire disclosure of which is hereby incorporated herein by reference: "INTEGRATED CIRCUIT DEVICE WITH CROSSED POWER STRAP LAYOUT," Ser. No. 60/527,857, filed Dec. 5, 2003, having Jhon Jhy Liaw named as inventor.

BACKGROUND

The present disclosure relates generally to static random access memory (SRAM) devices and, more specifically, to an SRAM device having a high aspect ratio cell boundary.

The physical dimension of a feature on a chip is referred to as "feature size." Reducing the feature size on a chip permits more components to be fabricated on each chip, and more components to be fabrication on each silicon wafer, thereby reducing manufacturing costs on a per-wafer and a per-chip basis. Increasing the number of components in each chip can also improve chip performance because more components may become available to satisfy functional requirements.

SRAM devices are one type of device that may undergo such scaling to reduce manufacturing costs. SRAM is random access memory that retains data bits in its memory as long as power is being supplied. Unlike dynamic random access memory (DRAM), SRAM does not have to be periodically refreshed. SRAM also provides faster access to data than DRAM. Thus, for example, SRAM is frequently employed in a computer's cache memory, or as part of the random access memory digital-to-analog converters in video cards.

However, SRAM is more expensive than other types of memory. Thus, SRAM designers and manufacturers continually strive to reduce the costs of manufacturing SRAM devices. The scaling of features sizes discussed above is one of the means to achieve such cost reduction. However, scaling feature sizes is not the only means available to reduce SRAM manufacturing costs. For example, modifying the layout of features within an SRAM chip to further increase the packing density of SRAM cells within each chip can also reduce manufacturing costs.

Accordingly, what is needed in the art is an SRAM device and method of manufacture thereof that addresses the above discussed issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
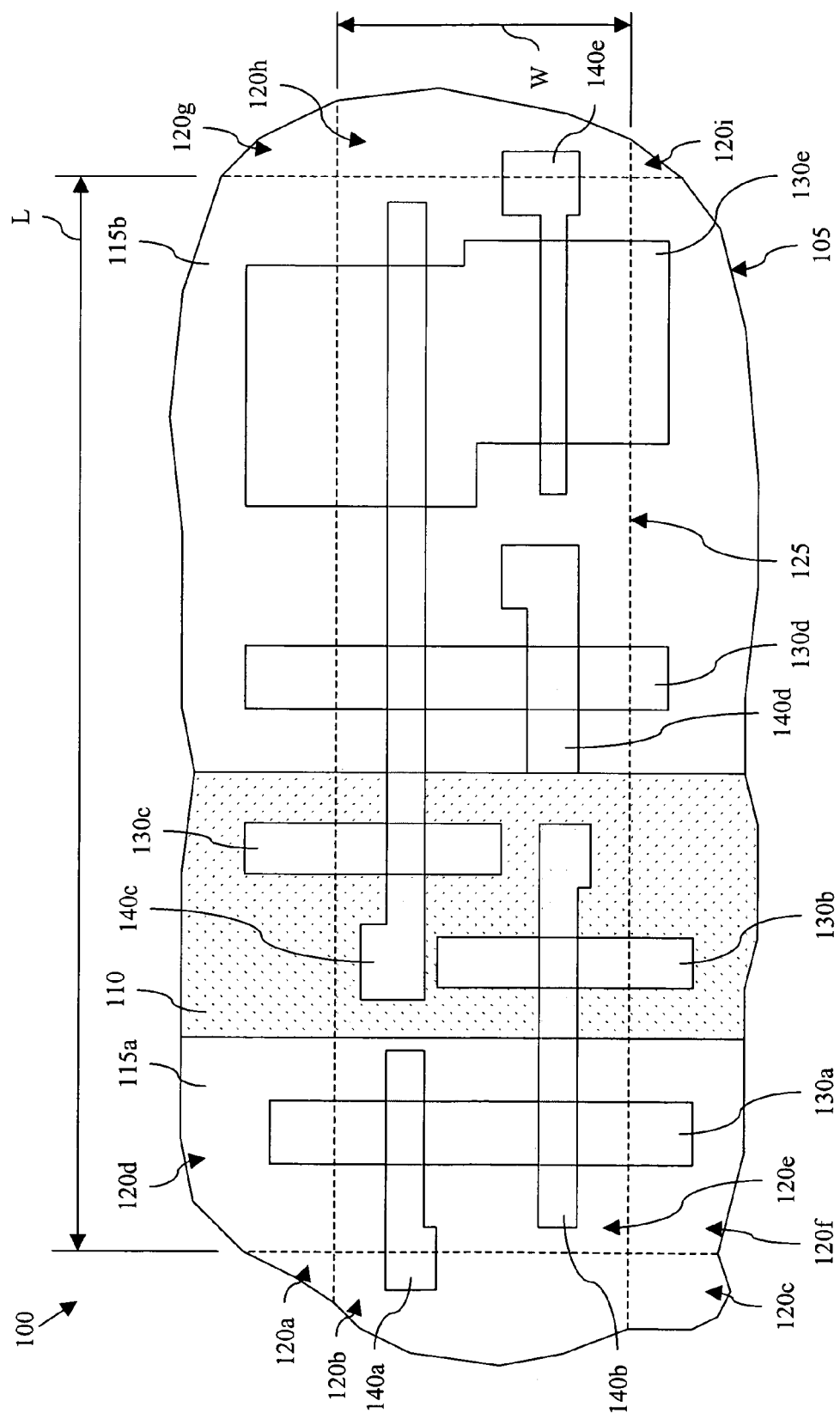
FIG. 1 illustrates a layout view of one embodiment of an SRAM device in an intermediate stage of manufacture according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a layout view of one embodiment of an SRAM device 100 constructed according to aspects of the present disclosure. The SRAM device 100 includes a substrate 105, an n-doped region 110, p-doped regions 115a, 115b, and SRAM unit cells 120a–i. Although only shown for SRAM unit cell 120e, each of the SRAM unit cells 120a–i may include active regions 130a–e and gate electrodes 140a–e within a unit cell boundary 125.

In one embodiment, the unit cell boundary 125 indicates an approximate midpoint between perimeter components of neighboring cells 120a–i. For example, in the illustrated embodiment, the upper segment of the cell boundary 125 (relative to the figure) may be located about midway between the outermost edge of the gate electrode 140c of cell 120e and the outermost edge of the gate electrode 140b of cell 120d. The area enclosed by the unit cell boundary 125 may also be proportional to one of the features in each unit cell 120a–i. For example, the area may be less than about $500(W_{GDP}^2)$, wherein $W_{GDP}$ is the width of the gate electrode 140b, 140c, or other features.

The substrate 105 may comprise silicon, gallium arsenide, gallium nitride, strained silicon, silicon germanium, silicon carbide, carbide, diamond, and/or other materials. The substrate 105 may also be or comprise a silicon-on-insulator (SOI) substrate, such as a silicon-on-sapphire substrate, a silicon germanium-on-insulator substrate, or another substrate comprising an epitaxial semiconductor layer on an insulator layer. In one embodiment, the substrate 105 may include an air gap to provide insulation of microelectronic devices formed thereon. For example, a silicon-on-nothing (SON) structure may be employed, such that the substrate 105 may include a thin insulation layer or gap comprising air and/or another insulator. In one such embodiment, the substrate 105 includes a silicon cap layer over or on a silicon germanium layer, wherein the silicon germanium layer is substantially or partially removed to form an air gap or void, thereby leaving the silicon cap layer as an insulated device active region for subsequently formed microelectronic devices.

The n-doped region 110 may be formed by a high energy implant through a patterned photoresist layer and into the substrate 105. N-type dopant impurities employed to form the n-doped region 110 may comprise phosphorus, arsenic, P31, stibium, and/or other materials. Subsequent diffusion, annealing, and/or electrical activation processes may also be employed after the impurity is implanted. The p-doped regions 115a, 115b may be similarly formed, although possibly with an energy level decreased, for example, in proportion to the atomic masses of the n-type and p-type dopants. P-type dopant impurities may comprise boron, boron fluoride, indium, and/or other materials. As with the formation of the n-doped region 110, formation of the p-doped regions 115a, 115b may include one or more diffusion, annealing, and/or electrical activation processes. Moreover, doping schemes other than that shown in the exemplary embodiment of FIG. 1 may be employed within the scope of the present disclosure. For example, the n-doped region 110 may be or comprise a p-doped well and the p-doped regions 115a, 115b may each be or comprise an n-doped well. Similarly, the doped regions 110, 115a, 115b may be doped with similar dopant types, although to varying degree of impurity concentration. Although not illustrated, the doped regions 110, 115a, 115b may collectively be enclosed in a deep n-doped or p-doped well.

In one embodiment, the doped regions 110, 115a, 115b employ boron as a p-type dopant and deuterium-boron complexes as an n-type dopant. The deuterium-boron complexes may be formed by plasma treatment of boron-doped diamond layers with a deuterium plasma. Alternatively, deuterium may be replaced with tritium, hydrogen, and/or other hydrogen-containing gases. The impurity concentration of the doped regions may be controlled by a direct current or a radio frequency bias of the substrate 105. The above-described processes may also be employed to form lightly-doped source/drain regions and/or at least portions of the active regions 130a–e in the substrate 105.

The active regions 130a–e may be subdivided or designated portions of the doped regions 110, 115a, 115b, or regions of different impurity concentration compared to the doped region in which a particular one of the active regions 130a–e is located. However, in one embodiment, the active regions 130a–e may be formed by first defining an oxide region over, on, or from the substrate 105. The oxide region may be defined by and/or during the same steps performed to define gate oxide layers corresponding to the gate electrodes 140a–e. A polysilicon layer may then be formed over the oxide region, possibly by selective deposition or by blanket deposition followed by patterning. In such an embodiment, the polysilicon layer may be a portion of the gate electrodes 140a–e. However, in some embodiments the polysilicon layer may not be formed. The polysilicon layer may also undergo a silicide process to form a silicide layer thereon. For example, the silicide may comprise $TiSi_2$, $CoSi_2$, $NiSi_2$, $WSi_2$ and/or other materials that may be suitable for a silicided gate interconnect. While not all embodiments will include the silicide layer, when the silicided layer is employed it may form a portion of the gate electrodes 140a–e.

The active regions 130a–e may also undergo an ion implantation process, perhaps at an energy ranging between about 30 keV and about 400 keV with an impurity concentration ranging between about $1 \times 10^{15}$ atoms/cm$^2$ and about $1 \times 10^{17}$ atoms/cm$^2$. The ion implant process may implant ions such that a higher concentration is located within the active regions 130a–e relative to neighboring components, features, or regions. The ion implant process may also implant ions in regions of the substrate 105 underlying the oxide regions, polysilicon layers, and/or silicide layers discussed above, when employed, thereby forming the active regions 130a–130e at least partially in the substrate 105. However, in one embodiment, the active regions 130a–e may be formed entirely within, on, or over the substrate 105. When the polysilicon layers and/or silicide layers described above are employed, the ion implant process utilized to form the active regions 130a–e may be performed before or after the above-described polysilicon layers and/or the silicide layers are formed. Additional and/or alternative processes may also be employed to form the active regions 130a–e. Moreover, in one embodiment, the resistance of the active regions 130a–e may range between about 1 kΩ and about 100 kΩ. For example, the resistance of the active regions 130a–e, or the resistance of the interfaces between the resistance of the active regions 130a–e and adjacent components, features, or regions may be about 3 kΩ.

The particular dopants employed to form the active regions 130a–e may depend on the particular layout of the application employing them. For example, if the active regions 130a–130e form a portion of an NMOS transistor, the dopant may be an n-type dopant, such as arsenic, P32, stibium, and/or other n-type dopants. In contrast, if the active regions 130a–e form a portion of a PMOS transistor, the dopant may be a p-type dopant, such as boron, $BF_2$, indium, and/or other p-type dopants. Moreover, the active regions 130a–e may be implanted with the different dopant types within a single embodiment.

As shown in FIG. 1, the active region 130a is formed in the p-doped region 115a, the active regions 130b and 130c are formed in the n-doped region 110, and the active regions 130d and 130e are formed in the p-doped region 115b. In one embodiment, the active regions 130a and 130d are offset from the n-doped region by less than about 70 nm. The active regions 130a–130e may be oriented substantially parallel to the longitudinal axes of the doped regions 110, 115a, 115b, and may extend beyond the boundary 125 of a particular SRAM unit cell 120a–i. One or more of the active regions 130a–e may also vary in width relative to others of the active regions 130a–e. For example, the active region 130e may also be substantially wider than one or more of the other active regions 130a–d. In one embodiment, the active region 130e may be wide enough to support more than one transistor device.

The gate electrodes 140a–e may comprise one or more patterned and/or selectively deposited layers of polysilicon, W, Ti, Ta, TiN, TaN, Hf, Mo, metal silicide, $SiO_2$, nitrided $SiO_2$, $SiO_xN_y$, $WSi_x$, V, Nb, $MoSi_x$, Cu, Al, carbon nanotubes, high-k dielectrics, alloys thereof, and/or other materials. Exemplary high-k dielectric materials include $Ta_2O_5$, $HfO_2$, $ZrO_2$, HfSiON, $HfSi_x$, $HfSi_xN_y$, $HfAlO_2$, $NiSi_x$. Such layers may also include portions of the polysilicon and/or silicide layers describe above. Manufacturing processes which may be employed to form the gate electrodes 140a–e include imprint lithography, immersion photolithography, maskless photolithography, chemical-vapor deposition (CVD), plasma-enhanced CVD (PECVD), atmospheric pressure CVD (APCVD), physical-vapor deposition (PVD), atomic layer deposition (ALD), and/or other processes. The process environment during such processing may include hydrogen ($H_2$) and carbon gas reactants, which may be excited by a plasma. The process gas may also include, $CH_4$, $C_2H_6$, $C_3H_8$, and/or other carbon containing sources.

The gate electrodes 140a–e may also include a seed layer comprising Ni, Cr, Nb, V, W, and/or other materials, possibly formed by PVD, ALD, PECVD, APCVD, and/or other processing techniques. The gate electrodes 140a–e may also include or be formed on or over one or more gate dielectric layers. Such gate dielectric layers may comprise $SiO_2$, SiON, HfO, $Ta_2O_5$, $Al_2O_3$, nitrided oxide, CVD oxide, thermal oxide, a nitrogen-containing dielectric material, a high-k dielectric material, and/or other materials, and may be formed by CVD, PECVD, PVD, ALD, and/or other processes.

As shown in FIG. 1, the gate electrode 140a may extend over the active region 130a and the gate electrode 140d may extend over the active region 130d. Moreover, one or more of the gate electrodes 140a–e may be shared gate electrodes, extending over more than one of the active regions 130a–e for supporting more than one transistor device. For example, the gate electrode 140b may extend over the active regions 130a and 130b and the gate electrode 140c may extend over the active regions 130c–e. Furthermore, the gate electrode 140e may extend over the active region 130e such that, because the active region 130e may be configured to support more than one transistor device, the gate electrode 140e may also support more than one transistor device despite extending over only a single active region. The gate electrodes 140a–e, whether or not they are configured as shared gate electrodes, may also extend beyond the boundary 125 of a particular SRAM unit cell 120a–i. Moreover, as in the illustrated embodiment, the gate electrodes 140a–e may also include wider portions, such as where subsequently formed contacts or vias may land.

The unit cell boundary 125 for each SRAM unit cell 120a–i may have an aspect ratio greater than about 3.2. The aspect ratio is the ratio of a larger primary dimension ("L" in the illustrated embodiment) of the cell 120a–i to a smaller primary dimension ("W" in the illustrated embodiment). For example, the SRAM unit cell 120e may have a length L ranging between about 0.32 µm and about 8 µm and a width W ranging between about 0.08 µm and about 2 µm, or an aspect ratio ranging between about 3 and about 6. In another embodiment, the SRAM unit cell 120e may have a length L ranging between about 12 nm and about 80 nm and a width W ranging between about 3 nm and about 20 nm. The aspect ratio of the cells 120a–i may also range between about 3 and about 6, and may vary from cell to cell. In another embodiment, the aspect ratio of one, several, or all of the cells 120a–i is greater than about 3.5.

Figure 2:
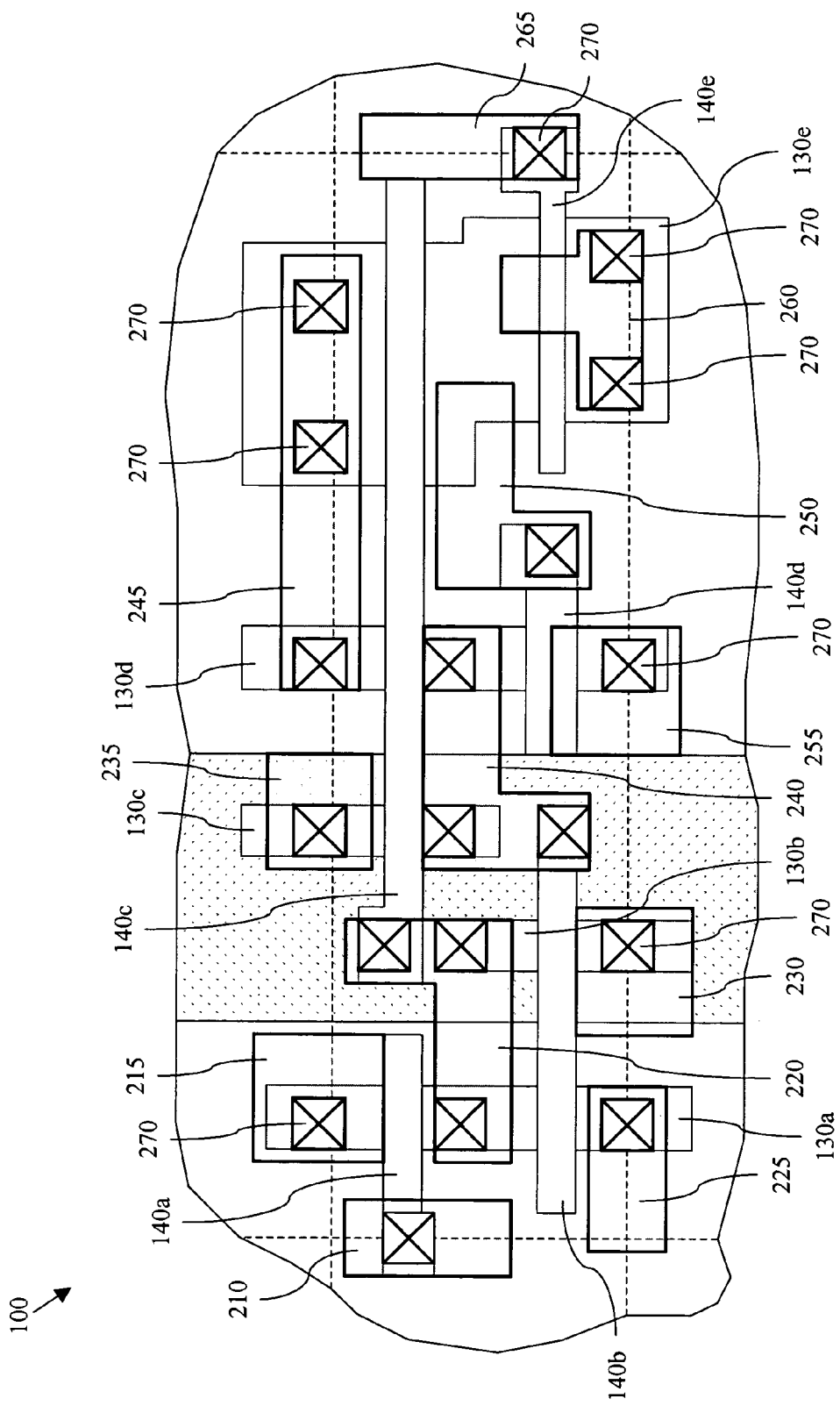
FIG. 2 illustrates a layout view of the SRAM device shown in FIG. 1 in a subsequent stage of manufacture.

Referring to FIG. 2, illustrated is a layout view of the SRAM device 100 shown in FIG. 1 in a subsequent stage of manufacture according to aspects of the present disclosure, wherein a metal layer has been formed over various previously formed features. The metal layer may include one or more layers comprising aluminum, gold, copper, silver, tungsten, titanium, titanium nitride, tantalum, tantalum nitride, alloys thereof, and/or other materials. Although not limited within the scope of the present disclosure, the metal layer may be formed by imprint lithography, immersion photolithography, maskless photolithography, CVD, PECVD, PVD, ALD, and/or other processes. The metal layer may also be formed by selective deposition or blanket deposition followed by a patterning process. In one embodiment, the metal layer is formed by one or more of the processes described above regarding the formation of the gate electrodes 140a–e, and/or comprises one or more of the materials described above regarding possible compositions of the gate electrodes 140a–e.

The metal layer may include a write port word line contact 210, a write port bit line contact 215, an interconnect 220, a common, ground potential, or Vss contact (hereafter collectively referred to as a Vss contact) 225, and power supply or Vcc contacts (hereafter collectively referred to as Vcc contacts) 230 and 235. The metal layer may also include interconnects 240, 245, and 250, a write port bit-bar line contact 255, a read port bit line contact 260, and a read port word line contact 265. One or more of the interconnects, such as the interconnect 220, may be substantially L-shaped for interconnect misaligned features.

The SRAM device also includes contacts or vias (hereafter collectively referred to as contacts) 270 extending between various components of the metal layer and underlying features. The contacts 270 may be formed by processes similar to those employed to form the metal layer, and may be formed prior to formation of the metal layer. However, in one embodiment, the contacts 270 may be formed by a damascene or dual-damascene process as part of the processes employed to form the metal layer. Many of the contacts 270 land on underlying features to delineate a number of transistors included in the SRAM device 100. In the illustrated embodiment, the SRAM device includes two pass-gate transistors (PG-1 and PG-2), two pull-down transistors (PD-1 and PD-2), two pull-up transistors (PU-1 and PU-2), and two read port transistors (RP-1 and RP-2). Table 1 lists the interconnections made by the contacts 270 to corresponding transistor nodes according the embodiment shown in FIG. 2. Each row in Table 1 indicates the existence of a contact 270 or other interconnection feature.

TABLE 1

| Metal Layer Component | Underlying Component | Transistor Node |
|---|---|---|
| write port word line contact 210 | gate electrode 140a | PG-1 gate |
| write port bit line contact 215 | active region 130a | PG-1 source |
| interconnect 220 | active region 130a | PG-1 drain/PD-1 source |
| interconnect 220 | active region 130b | PU-1 drain |
| interconnect 220 | gate electrode 140c | PU-2 gate/PD-2 gate/RP-2 gate |
| Vss contact 225 | active region 130a | PD-1 drain |
| Vcc contact 230 | active region 130b | PU-1 source |
| Vcc contact 235 | active region 130c | PU-2 source |
| interconnect 240 | gate electrode 140b | PD-1 gate/PU-1 gate |
| interconnect 240 | active region 130c | PU-2 drain |
| interconnect 240 | active region 130d | PD-2 source/PG-2 drain |
| interconnect 245 | active region 130d | PD-2 drain |

TABLE 1-continued

| Metal Layer Component | Underlying Component | Transistor Node |
|---|---|---|
| interconnect 245 | active region 130e | RP-1 source |
| interconnect 245 | active region 130e | RP-2 drain |
| interconnect 250 | gate electrode 140d | PG-2 gate |
| write port bit-bar line contact 255 | active region 130d | PG-2 source |
| read port bit line contact 260 | active region 130e | RP-1 drain |
| read port bit line contact 260 | active region 130e | RP-2 source |
| read port word line contact 265 | gate electrode 140e | RP-1 gate |

Of course, other features or components may interpose the metal layer and the underlying features for interconnection thereof, either in addition to or in the alternative to one or more of the contacts 270. Interconnection schemes other than that described in Table 1 are also within the scope of the present disclosure. The SRAM device may also include more or fewer transistors and/or contacts 270 than in the illustrated embodiment.

Figure 3:
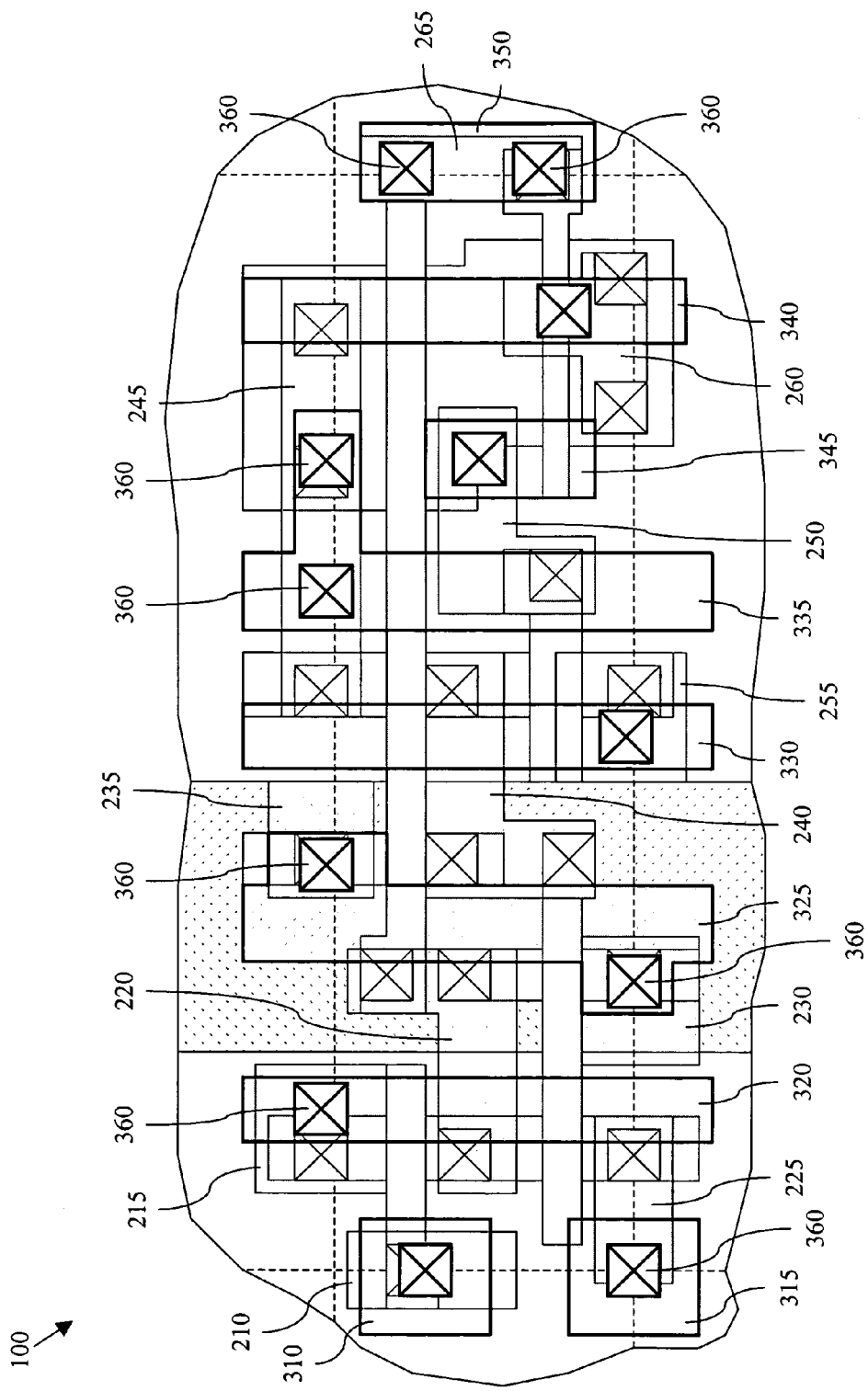
FIG. 3 illustrates a layout view of the SRAM device shown in FIG. 2 in a subsequent stage of manufacture.

Referring to FIG. 3, illustrated is a layout view of the SRAM device 100 shown in FIG. 2 in a subsequent stage of manufacture according aspects of the present disclosure, in which a second metal layer is formed over the first metal layer. In one embodiment, the second metal layer is substantially similar in composition and manufacture to the first metal layer described above.

The second metal layer includes a write port word line contact 310, a Vss contact 315, interconnects 320, 325, 330, 335, and 340, a write port word line contact 345, and a read port word line contact 350. The SRAM device also includes contacts 360 extending between various components of the first and second metal layers. Thus, one or more of the contacts 360 (and many other contacts described herein) may be or comprise a landing pad for receiving a subsequently formed contact or via. In one embodiment, the contacts 360 are substantially similar in composition and manufacture to the contacts 270 shown in FIG. 2. Table 2 lists the interconnections made between the first and second metal layers by the contacts 360. Each row in Table 2 indicates the existence of a contact 360 or other interconnection feature.

TABLE 2

| Metal Layer 2 Component | Metal Layer 1 Component |
|---|---|
| write port word line contact 310 | write port word line contact 210 |
| Vss contact 315 | Vss contact 225 |
| interconnect 320 | write port bit line contact 215 |
| interconnect 325 | Vcc contact 230 |
| interconnect 325 | Vcc contact 235 |
| interconnect 330 | write port bit-bar line contact 255 |
| interconnect 335 | interconnect 245 |
| interconnect 335 | interconnect 245 |
| interconnect 340 | read port bit line contact 260 |
| write port word line contact 345 | interconnect 250 |
| read port word line contact 350 | read port word line contact 265 |
| read port word line contact 350 | read port word line contact 265 |

Of course, other features or components may interpose the first and second metal layers for interconnection thereof, either in addition to or in the alternative to one or more of the contacts 360. Interconnection schemes other than that described in Table 2 are also within the scope of the present disclosure.

Figure 4:
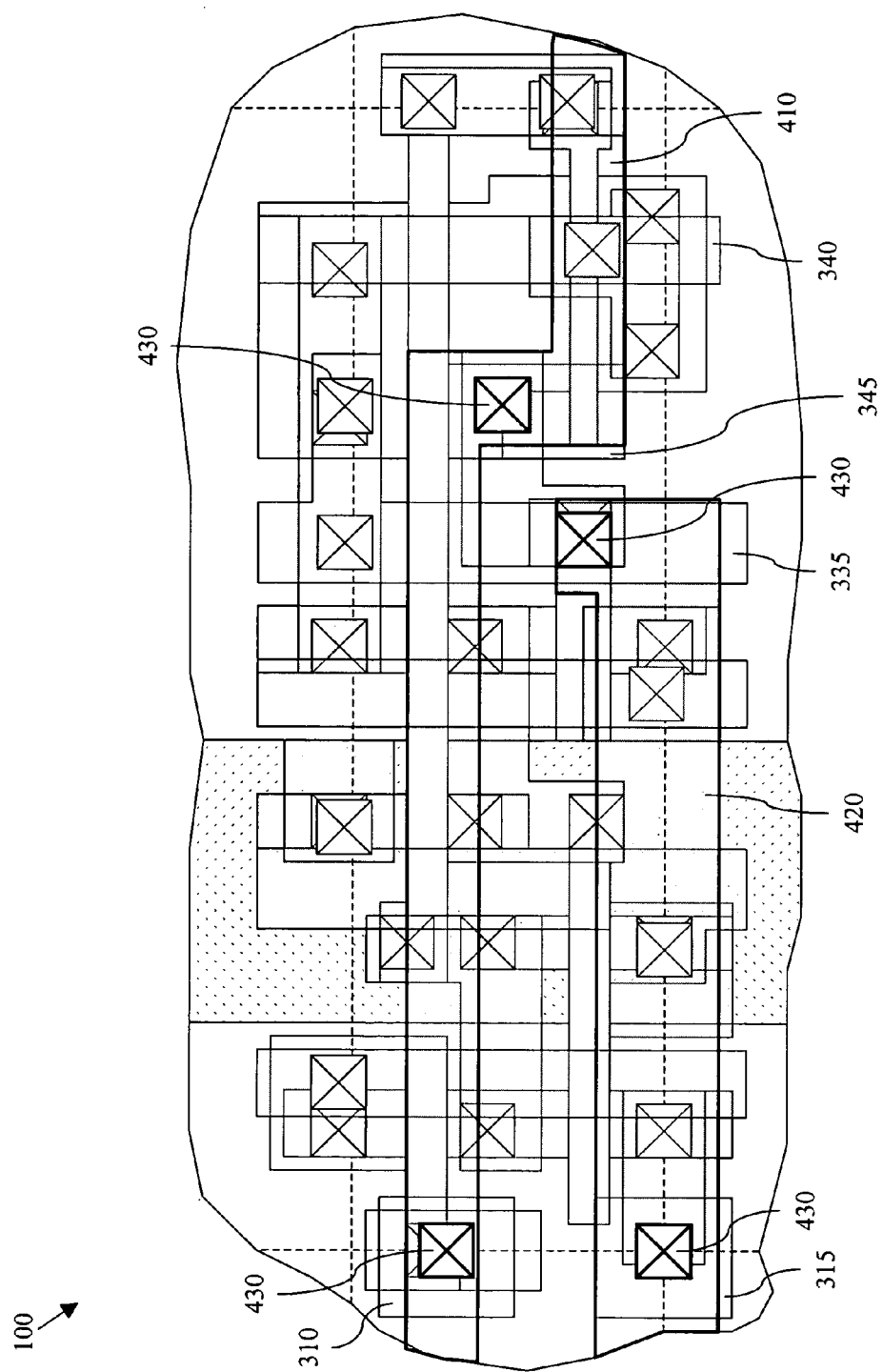
FIG. 4 illustrates a layout view of the SRAM device shown in FIG. 3 in a subsequent stage of manufacture.

Referring to FIG. 4, illustrated is a layout view of the SRAM device 100 shown in FIG. 3 in a subsequent stage of manufacture according aspects of the present disclosure, in which a third metal layer is formed over the second metal layer. In one embodiment, the third metal layer is substantially similar in composition and manufacture to the first metal layer described above.

The third metal layer includes a write port word line interconnect 410 and a Vss interconnect 420. The SRAM device also includes contacts 430 extending between various components of the second and third metal layers. In one embodiment, the contacts 430 are substantially similar in composition and manufacture to the contacts 270 shown in FIG. 2. Table 3 lists the interconnections made between the second and third metal layers by the contacts 430. Each row in Table 3 indicates the existence of a contact 430 or other interconnection feature.

TABLE 3

| Metal Layer 3 Component | Metal Layer 2 Component |
|---|---|
| write port word line interconnect 410 | write port word line contact 310 |
| write port word line interconnect 410 | write port word line contact 345 |
| Vss interconnect 420 | Vss contact 315 |
| Vss interconnect 420 | interconnect 335 |

Of course, other features or components may interpose the second and third metal layers for interconnection thereof, either in addition to or in the alternative to one or more of the contacts 430. Interconnection schemes other than that described in Table 3 are also within the scope of the present disclosure.

Figure 5:
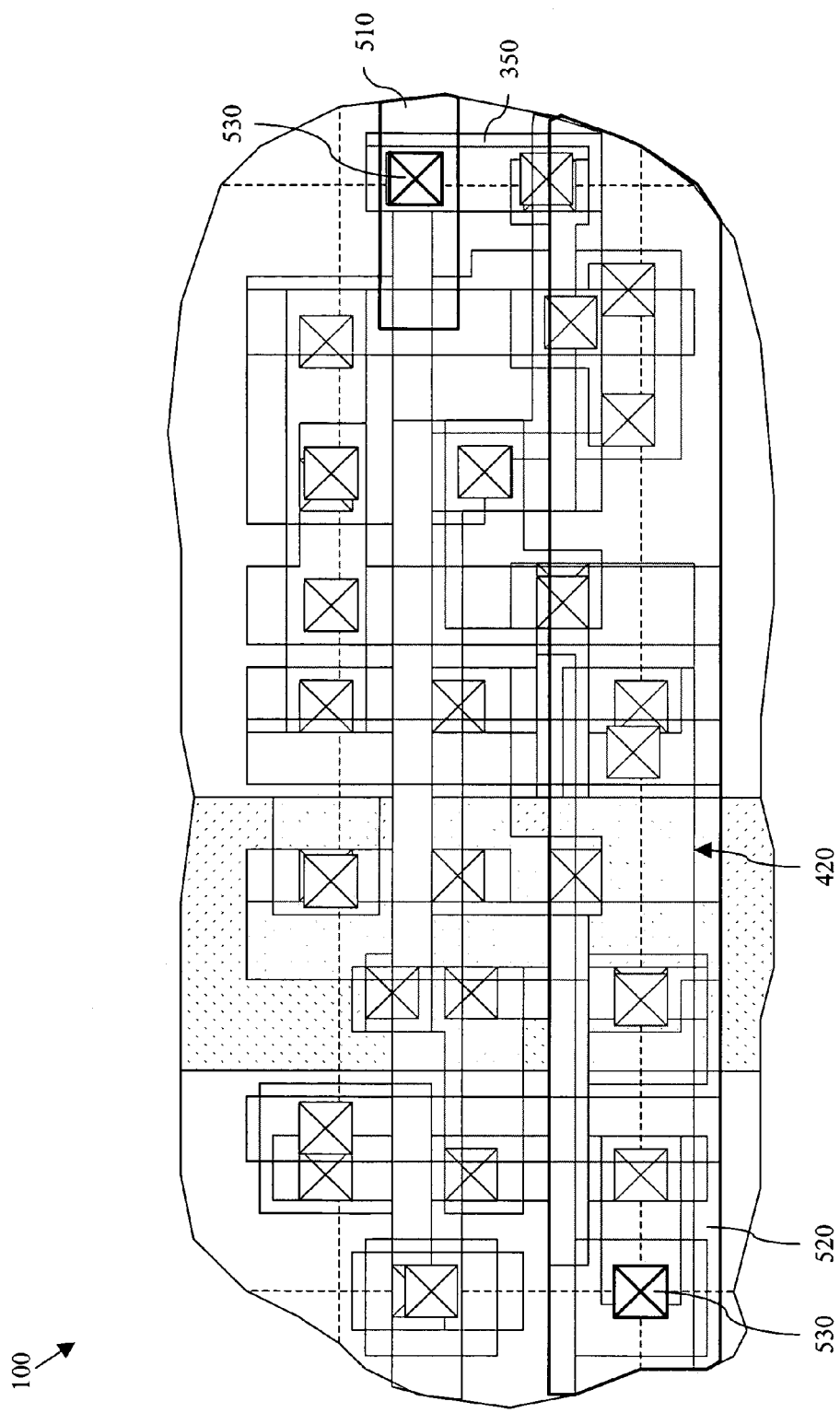
FIG. 5 illustrates a layout view of the SRAM device shown in FIG. 4 in a subsequent stage of manufacture.

Referring to FIG. 5, illustrated is a layout view of the SRAM device 100 shown in FIG. 4 in a subsequent stage of manufacture according aspects of the present disclosure, in which a fourth metal layer is formed over the third metal layer. In one embodiment, the fourth metal layer is substantially similar in composition and manufacture to the first metal layer described above.

The fourth metal layer includes a read port word line interconnect 510 and a Vss interconnect 520. The SRAM device also includes contacts 530 extending between various components of the third and fourth metal layers. In one embodiment, the contacts 530 are substantially similar in composition and manufacture to the contacts 270 shown in FIG. 2. Table 4 lists the interconnections made between the third and fourth metal layers by the contacts 530. Each row in Table 4 indicates the existence of a contact 530 or other interconnection feature.

TABLE 4

| Metal Layer 4 Component | Metal Layer 3 Component |
|---|---|
| read port word line interconnect 510 | write port word line interconnect 410 |
| Vss interconnect 520 | read port word line contact 350 |

Of course, other features or components may interpose the third and fourth metal layers for interconnection thereof, either in addition to or in the alternative to one or more of the contacts 530. Interconnection schemes other than that described in Table 4 are also within the scope of the present disclosure.

After the features shown in FIG. 5 have been formed, the SRAM device 100 may be completed by conventional and/or future-developed processes. For example, additional metal layers may be formed over the fourth metal layer shown in FIG. 5, such as for the further interconnection of the SRAM device 100 with other devices or components, including other SRAM devices, in the chip and/or wafer in which the SRAM device 100 is incorporated. In one embodiment, multiple instances of the SRAM device 100 may be substantially repeated to form an SRAM memory array.

The SRAM device 100 described above also includes one or more inter-metal dielectric or other insulating layers interposing the various conductive components. Such insulating layers, each of which may itself comprise multiple insulating layers, may be planarized to provide a substantially planar surface for subsequent processing. The insulating layers may comprise $SiO_2$, fluoride-doped glass (FSG), SiLK™ (a product of Dow Chemical of Michigan), Black Diamond® (a product of Applied Materials of Santa Clara, Calif.), and/or other materials, and may be formed by CVD, ALD, PVD, spin-on coating, and/or other processes.

Figure 6:
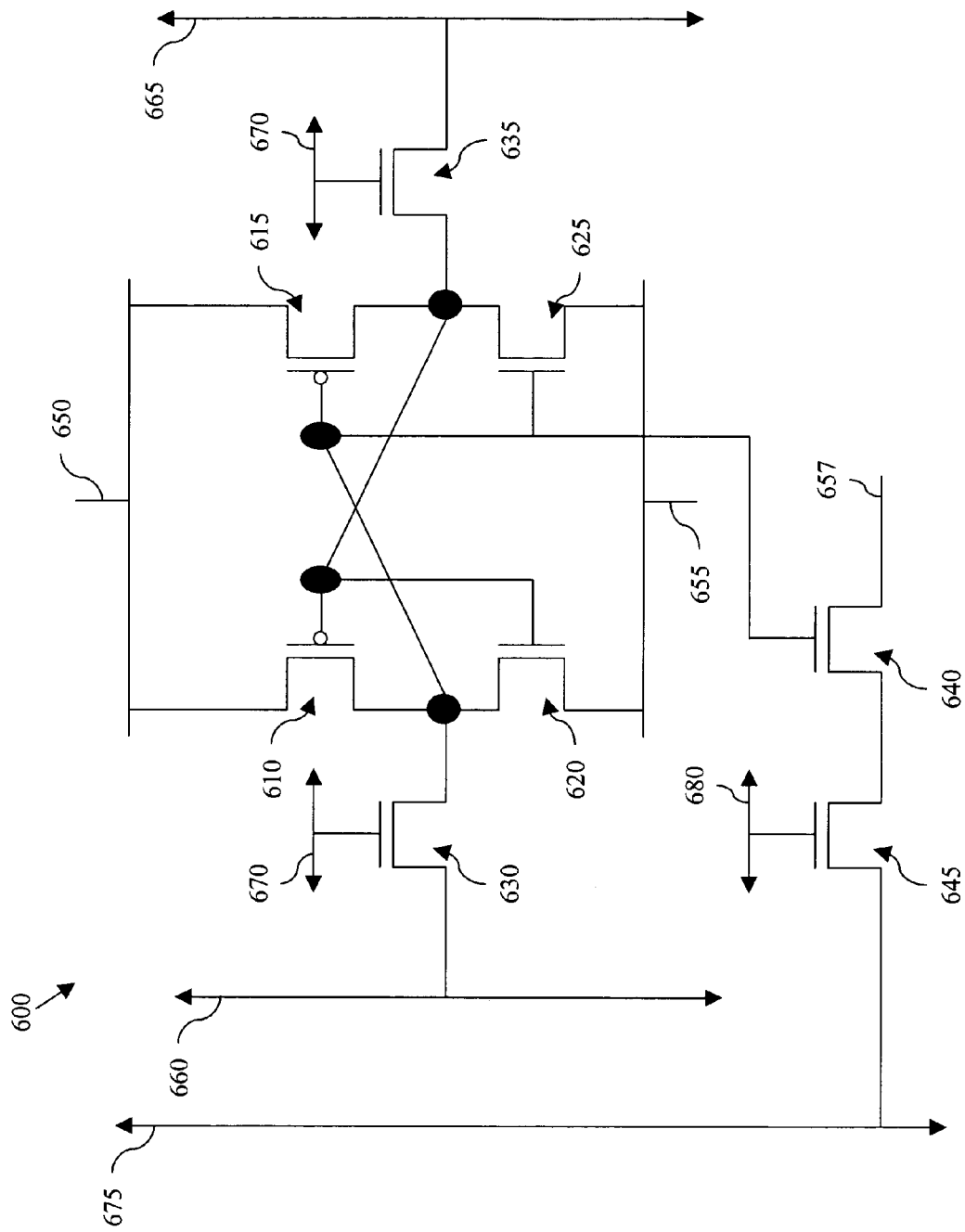
FIG. 6 illustrates a circuit diagram of another embodiment of an SRAM device according to aspects of the present disclosure.

Referring to FIG. 6, illustrated is a circuit diagram of one embodiment of an SRAM device 600 according to aspects of the present disclosure. The SRAM device 600 may be substantially similar to the SRAM device 100 shown in FIG. 5. The SRAM device 600 includes pull-up transistors 610, 615, pull-down transistors 620, 625, pass-gate transistors 630, 635, and read port transistors 640, 645. In one embodiment, the pull-up transistors 610, 615 are PMOS transistors, whereas the pull-down transistors 620, 625, pass-gate transistors 630, 635, and read port transistors 640, 645 are NMOS transistors, although other configurations of NMOS and PMOS transistors are within the scope of the present disclosure.

The sources of the pull-up transistors 610, 615 are electrically coupled to a power source (referred to herein as Vcc) 650. The drain of the pull-up transistor 610 is electrically coupled to the source of the pass-gate transistor 630, the source of the pull-down transistor 620, and the gate of the pull-up transistor 615. Similarly, the drain of the pull-up transistor 615 is electrically coupled to the source of the pass-gate transistor 635, the source of the pull-down transistor 625, and the gate of the pull-up transistor 610. The gate of the pull-up transistor 610 is also electrically coupled to the gate of the pull-down transistor 620. Similarly, the gate of the pull-up transistor 615 is also electrically coupled to the gate of the pull-down transistor 625, and is also electrically coupled to the gate of the read port transistor 640.

The drains of the pull-down transistors 620, 625 are electrically coupled to a ground, common, or Vss contact (hereafter collectively referred to as a Vss contact) 655. The drain of the read port transistor 640 is also electrically coupled to a Vss contact 657.

The drains of the pass-gate transistors 630, 635 are electrically coupled to a write port bit line 660 and a fead write port bit-bar line 665, respectively. The gates of the pass-gate transistors 630, 635 are electrically coupled to a write port word line 670. The read port transistors 640, 645 are electrically coupled between the Vss contact 657 and a read port bit line 675, wherein the gate of the read port transistor 645 is electrically coupled to a read port word line 680. The write port bit and bit-bar lines 660, 665, the write port word line 670, the read port bit line 675, and the read port word line 680 may extend to other SRAM cells and/or other components, including row and colunm latch, decoder, and select drivers, control and logic circuitry, sense amps, muxes, buffers, etc. In one embodiment, a maximum capacitance of a write port charge storage node of the SRAM device 600 is less than about 0.6 farads.

Figure 7:
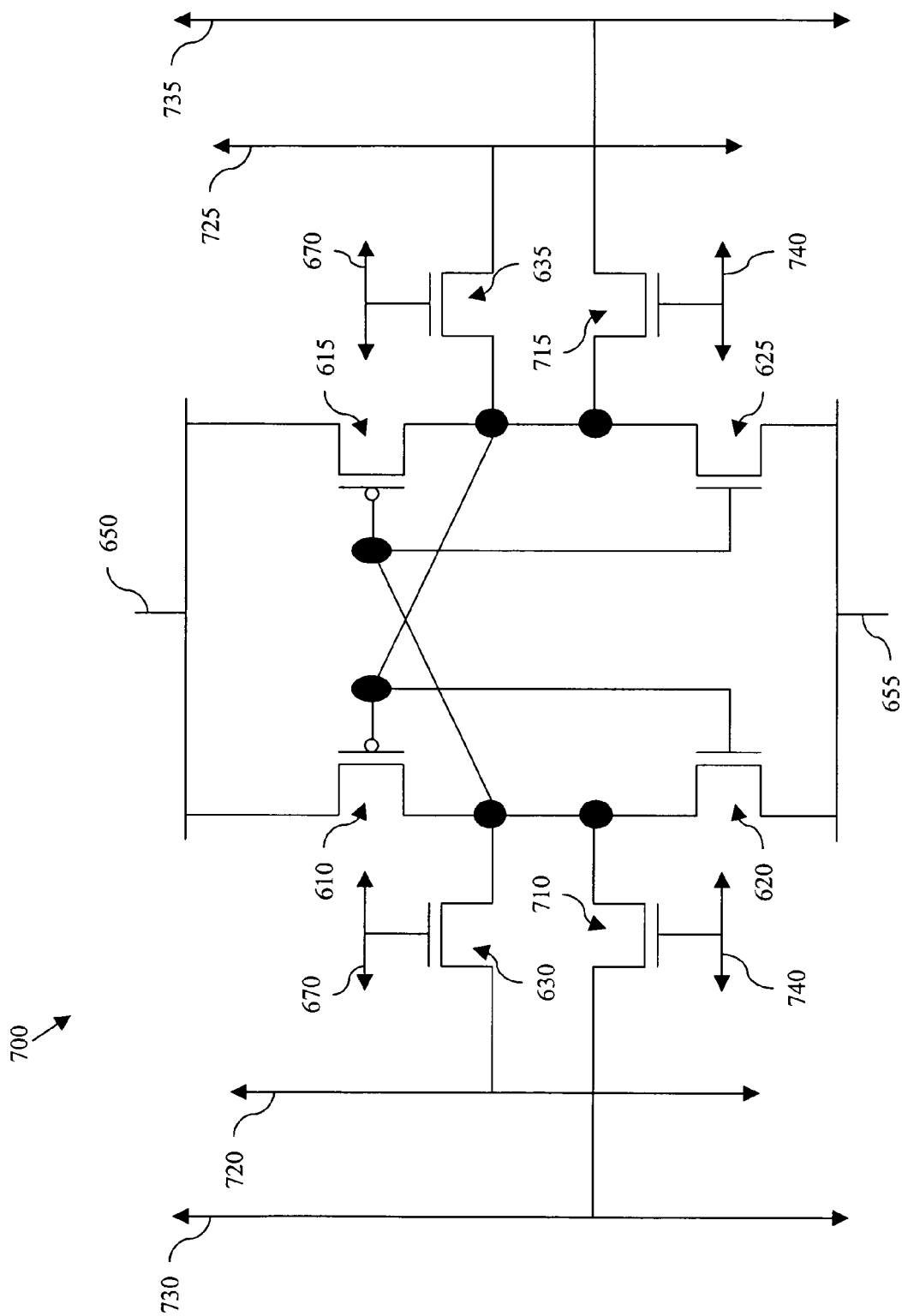
FIG. 7 illustrates a circuit diagram of another embodiment of the SRAM device shown in FIG. 6.

Referring to FIG. 7, illustrated is a circuit diagram of another embodiment of the SRAM device shown in FIG. 6, herein designated by the reference numeral 700. The SRAM device 700 may be substantially similar to the SRAM device 100 shown in FIG. 5. The SRAM device 700 is also substantially similar to the SRAM device 600 shown in FIG. 6 with the exception that the read port transistors 640, 645 are replaced with additional pass-gate transistors 710, 715, as well as modifications to the interconnection of transistors with input/output circuitry, as described below.

In the embodiment shown in FIG. 7, the drain of the pass-gate transistor 630 is electrically coupled to a first port bit line 720 and the drain of the pass-gate transistor 635 is electrically coupled to a first port bit-bar line 725. The pass-gate transistor 710 is electrically coupled in series between the source of the pull-down transistor 620 and a second port bit line 730, wherein the gate of the pass-gate transistor 710 is electrically coupled to a second port word line 740. Similarly, the pass-gate transistor 715 is electrically coupled in series between the source of the pull-down transistor 625 and a second port bit-bar line 735, wherein the gate of the pass-gate transistor 715 is electrically coupled to the second port word line 740.

Figure 8:
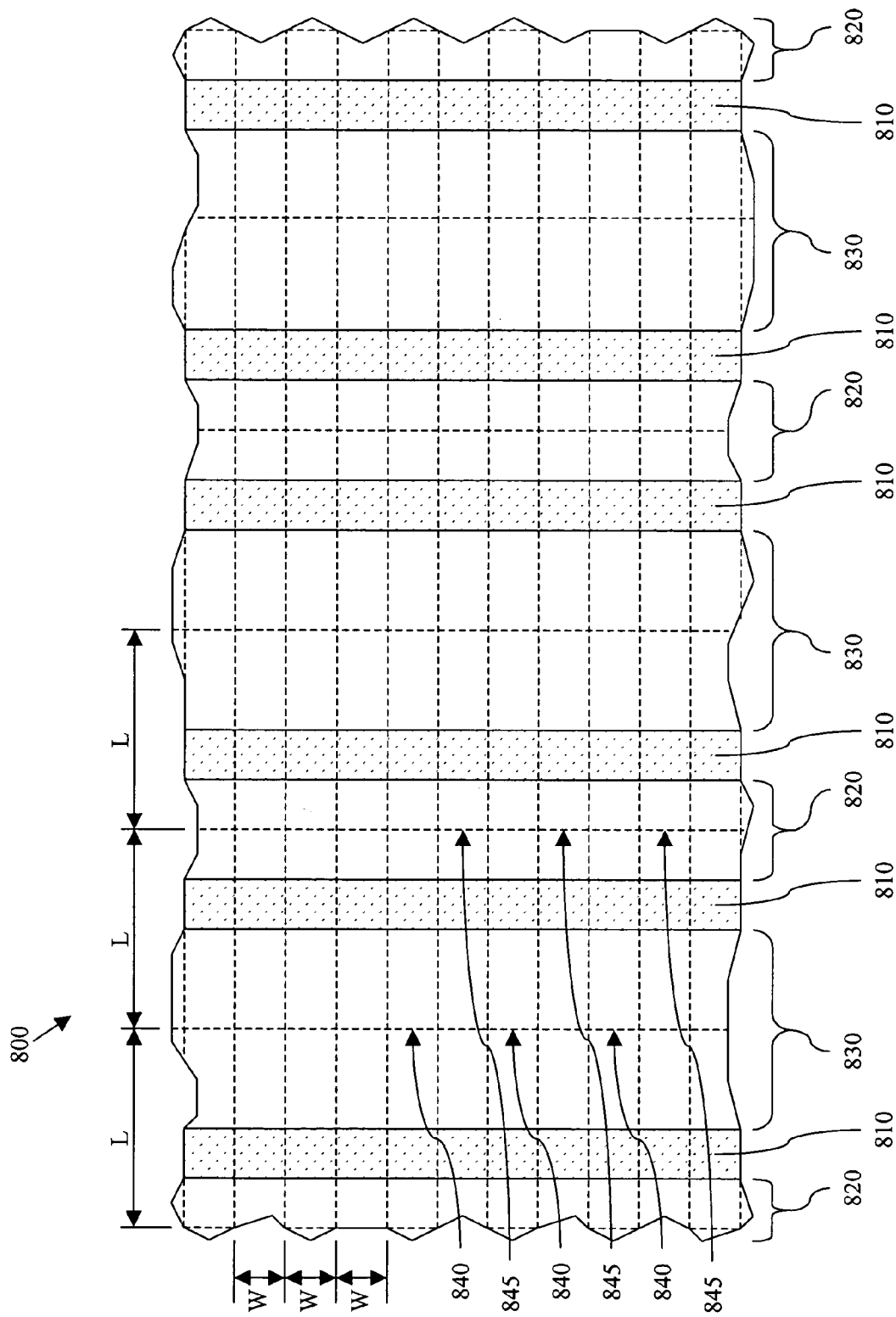
FIG. 8 illustrates a plan view of a portion of an SRAM device manufacturing wafer according to aspects of the present disclosure.

Referring to FIG. 8, illustrated is a plan view of a portion of an SRAM device manufacturing wafer 800 according to aspects of the present disclosure. The wafer 800 may be employed in the manufacture of the SRAM devices 100, 600, and/or 700 described above. The illustrated portion of the wafer 800 includes doped regions 810 having a first dopant type and doped regions 820, 830 having a second dopant type. For example, the doped regions 810 may be n-doped regions and the doped regions 820, 830 may be p-doped regions. Each doped region 810 may interpose a doped region 820 and a doped region 830. Two or more of the doped regions 810, 820, and 830 may also be substantially parallel. In one embodiment, as shown in FIG. 8, all of the doped regions 810, 820, and 830 are substantially parallel. The pitch between neighboring doped regions 830 may range between about 3 µm and about 5 µm. In one embodiment, the pitch between neighboring doped regions is about 3.6 µm.

FIG. 8 also illustrates the formation of SRAM unit cells 840, 845 having an increased packing density. The cells 840, 845 may each have a longitudinal axis that is substantially perpendicular to the longitudinal axes of the doped regions 810, 820, and 830. The cells 840, 845 may also have common or substantially aligned longitudinal axes. Each of the cells 840, 845 may also have substantially equal lengths (L), substantially equal widths (W), and/or substantially equal aspects ratios (L/W). In one embodiment, one or more of the cells 840, 845 have an aspect ratio of at least about 3.2.

One of more of the SRAM unit cells 840, 845 may be substantially similar to the SRAM devices 100, 600, and/or 700 described above. The cells 845 may be mirror images or rotated versions of the cells 840. Each of the cells 840, 845 extend from an approximate midpoint of a doped region 820 to an approximate midpoint of a doped region 830, thereby extending over a doped region 810. Thus, each of the cells 840, 845 may include a segment of a doped region 810 spanning the entire width of the doped region 810, a segment of a doped region 820 spanning a portion of the width of the doped region 820, and a segment of a doped region 830 spanning a portion of the width of the doped region 830. In one embodiment, the area of a cell 840, 845 overlying a doped region 830 may be greater than the area overlying a doped region 820 by an amount ranging between about 100% and about 500%.

Thus, the present disclosure introduces an SRAM device including a substrate and an SRAM unit cell. The substrate includes an n-doped region interposing first and second p-doped regions. The SRAM unit cell includes: (1) a first pass-gate transistor and a first pull-down transistor located at least partially over the first p-doped region; (2) first and second pull-up transistors located at least partially over the n-doped region; and (3) a second pass-gate transistor, a second pull-down transistor, and first and second read port transistors, all located at least partially over the second p-doped region. A boundary of the SRAM unit cell comprises first and second primary dimensions having an aspect ratio of at least about 3.2. In another embodiment of an SRAM device constructed according to aspects of the present disclosure, the SRAM unit cell includes third and fourth pass-gate transistors located at least partially over the second p-doped region. In one embodiment, an SRAM device of the present disclosure includes a boundary having an aspect ratio of at least about 3.5.

The present disclosure also provides an SRAM device in which the SRAM unit cell includes: (1) a first pass-gate transistor and a first pull-down transistor located at least partially over the first p-doped region; (2) first and second pull-up transistors located at least partially over the n-doped region; and (3) a second pass-gate transistor, a second pull-down transistor, and first and second read port transistors, all located at least partially over the second p-doped region. Such an embodiment may also include a first transistor active region implanted in the first p-doped region and extending between source/drain contacts of the first pass-gate transistor and the first pull-down transistor. A second transistor active region may also be implanted in the second p-doped region and extend between source/drain contacts of the second pass-gate transistor and the second pull-down transistor.

A method of manufacturing an SRAM device is also introduced in the present disclosure. In one embodiment, the method includes providing a substrate having a first doped region of a first dopant type, wherein the first doped region interposes second and third doped regions of a second dopant type. First and second pull-up transistors are formed at least partially over the first doped region. A first pass-gate transistor and a first pull-down transistor are formed at least partially over the second doped region. A second pass-gate transistor, a second pull-down transistor, and first and second read port transistors, are also formed at least partially over the third doped region. The first and second pass-gate, pull-down, pull-up, and read port transistors form an SRAM unit cell, wherein a boundary of the SRAM unit cell has first and second primary dimensions forming an aspect ratio of at least about 3.2.

The present disclosure also introduces an integrated circuit device including, in one embodiment, a substrate having a plurality of first doped regions of a first dopant type, a plurality of second doped regions of a second dopant type, and a plurality of third doped regions of the second dopant type. Each of the first doped regions interpose one of the plurality of second doped regions and one of the plurality of third doped regions. The integrated circuit device also includes a plurality of SRAM devices. Each of the SRAM devices includes first and second pull-up transistors located at least partially over one of the plurality of first doped regions. The SRAM devices also include a first pass-gate transistor and a first pull-down transistor located at least partially over one of the plurality of second doped regions adjacent the one of the plurality of first doped regions. The SRAM devices also include a second pass-gate transistor, a second pull-down transistor, and first and second read port transistors, all located at least partially over one of the plurality of third doped regions adjacent the one of the plurality of first doped regions and opposite the one of the plurality of second doped regions. The first and second pass-gate, pull-down, pull-up, and read port transistors form an SRAM unit cell, wherein a boundary of the SRAM unit cell has first and second primary dimensions forming an aspect ratio of at least about 3.2. The integrated circuit device also includes a plurality of interconnects interconnecting ones of the first and second pull-up, pass-gate, pull-down, and read port transistors.

Another embodiment introduces an SRAM device including at least eight transistors, wherein two of the transistors may be adapted for input/output (I/O) with at least one feature having channel dimensions substantially larger than the channel dimensions of the feature of the SRAM device. Alternatively, the SRAM device may further include at least eight transistors, wherein two of the transistors may be connected in series and are adapted for input/output (I/O), having channel dimensions substantially larger than the channel dimensions of the other transistors in the SRAM device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A static random access memory (SRAM) device, comprising:
    a substrate having an n-doped region interposing first and second p-doped regions; and an SRAM unit cell including:
        a first pass-gate transistor and a first pull-down transistor located at least partially over the first p-doped region;
        first and second pull-up transistors located at least partially over the n-doped region;
        a second pass-gate transistor, a second pull-down transistor, and first and second read port transistors, all located at least partially over the second p-doped region;
        a first transistor active region implanted in the first p-doped region and extending between source/drain contacts of the first pass-gate transistor and the first pull-down transistor; and
        a second transistor active region implanted in the second p-doped region and extending between source/drain contacts of the second pass-gate transistor and the second pull-down transistor.

2. The SRAM device of claim 1 further comprising a third transistor active region implanted in the second p-doped region and extending between source/drain contacts of the first and second read port transistors.

3. The SRAM device of claim 2 further comprising:
a read port word line electrically coupled to a gate contact of the first read port transistor;
a read port bit line electrically coupled to a drain contact of the first read port transistor;
a gate conductor at least partially forming a gate contact of the second read port transistor and a gate contact of the second pull-down transistor; and
a ground conductor electrically coupled to a source contact of the second read port transistor;
wherein the third transistor active region couples a source contact of the first read port transistor and a drain contact of the second read port transistor.

4. The SRAM device of claim 1 further comprising a first interconnect structure metal layer comprising a plurality of first metal layer conductors, including a first L-shaped interconnect coupling drain contacts of the first pass-gate transistor and the first pull-up transistor with a gate contact of the second pull-up transistor.

5. The SRAM device of claim 4 wherein the plurality of first metal layer conductors further includes a power source line landing pad, a ground conductor line landing pad, a bit line landing pad, a bit-bar line landing pad, a write word line landing pad, and a read word line landing pad.

6. The SRAM device of claim 4 wherein the plurality of first metal layer conductors includes a second L-shaped interconnect coupling drain contacts of the second pass-gate transistor and the second pull-up transistor with a gate contact of the first pull-up transistor.

7. The SRAM device of claim 4 further comprising a second interconnect structure metal layer comprising a plurality of second metal layer conductors, including a power source line interconnect, a ground line interconnect, a write bit line interconnect, a write bit-bar line interconnect, a read bit line interconnect, and word line landing pads.

8. The SRAM device of claim 7 further comprising a plurality of first vias coupling ones of the plurality of first metal layer conductors with corresponding ones of the second metal layer conductors.

9. The SRAM device of claim 7 further comprising a third interconnect structure metal layer comprising a plurality of third metal layer conductors, including a ground line interconnect, a write word line interconnect, and a read word line landing pad.

10. The SRAM device of claim 9 further comprising a plurality of second vias coupling ones of the plurality of second metal layer conductors with corresponding ones of the third metal layer conductors.

11. The SRAM device of claim 9 further comprising a fourth interconnect structure metal layer comprising a plurality of fourth metal layer conductors, including at least one read word line interconnect.

12. The SRAM device of claim 11 further comprising a plurality of third vias coupling ones of the plurality of third metal layer conductors with corresponding ones of the fourth metal layer conductors.

13. The SRAM device of claim 1 wherein at least one of the transistors includes a gate dielectric layer comprising a material selected from the group consisting of:
$SiO_2$;
SiON;
HfO;
$Ta_2O_5$; and
$Al_2O_3$.

14. The SRAM device of claim 1 wherein at least one of the transistors includes a gate dielectric layer comprising a material selected from the group consisting of:
nitrided oxide;
CVD oxide; and
thermal oxide.

15. The SRAM device of claim 1 wherein at least one of the transistors includes a gate dielectric layer comprising a nitrogen containing dielectric material.

16. The SRAM device of claim 1 wherein at least one of the transistors includes a gate dielectric layer comprising a high-k dielectric material.

17. The SRAM device of claim 1 wherein the n-doped region and the first and second p-doped region are enclosed within a deep n-doped region.

18. The SRAM device of claim 1 wherein a maximum capacitance of a write port charge storage node of the SRAM unit cell is less than about 0.6 farads.

19. The SRAM device of claim 1 wherein the area of the SRAM unit cell boundary is less than about 500(WGPD2), wherein WGPD is the width of a gate of one of the first and second pull-down transistors.

20. The SRAM device of claim 1 wherein the substrate comprises a material selected from the group consisting of:
bulk Si;
SiGe;
strained Si;
silicon-on-insulator (SOI);
silicon-on-nothing (SON); and
diamond.

21. The SRAM device of claim 1 wherein the SRAM unit cell further comprises a plurality of ground conductor lines on at least two metal layers of an interconnect structure interconnecting the transistors.

22. The SRAM device of claim 1 wherein the SRAM unit cell further comprises a bit line and a bit-bar line on different metal layers of an interconnect structure interconnecting the transistors.

23. The SRAM device of claim 1 wherein the area of one of the first and second p-doped regions within the SRAM unit cell boundary is greater than the area of the other of the first and second p-doped regions within the SRAM unit cell boundary by an amount ranging between about 100% and about 500%.

24. The SRAM device of claim 1 wherein a boundary of the SRAM unit cell has a length ranging between about 0.32 microns and about 8 microns and a width ranging between about 0.08 microns and about 2 microns.

25. The SRAM device of claim 1 wherein a boundary of the SRAM unit cell has a length ranging between about 12 nm and about 80 nm and a width ranging between about 3 nm and about 20 nm.

26. The SRAM device of claim 1 wherein a boundary of the SRAM unit cell has an aspect ratio ranging between about 3 and about 6.

27. The SRAM device of claim 1 wherein a boundary of the SRAM unit cell has an aspect ratio of about 3.2.

28. The SRAM device of claim 1 wherein a boundary of the SRAM unit cell has an aspect ratio of about 3.5.

* * * * *